United States Patent
Riggsby

(10) Patent No.: US 7,548,696 B2
(45) Date of Patent: Jun. 16, 2009

(54) FIBER-TO-THE-HOME (FTTH) OPTICAL RECEIVER WITH DISTRIBUTED GAIN CONTROL

(75) Inventor: Robert R. Riggsby, Atlanta, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 416 days.

(21) Appl. No.: 11/276,119

(22) Filed: Feb. 15, 2006

(65) Prior Publication Data

US 2007/0189780 A1 Aug. 16, 2007

(51) Int. Cl.
*H04J 14/00* (2006.01)
(52) U.S. Cl. .............................. 398/71; 398/66; 398/58; 398/158; 398/33
(58) Field of Classification Search ................. 398/202, 398/71, 115, 72, 66, 58, 158, 33
See application file for complete search history.

(56) References Cited

U.S. PATENT DOCUMENTS

| | | | |
|---|---|---|---|
| 4,553,105 A * | 11/1985 | Sasaki | 330/145 |
| 4,870,369 A | 9/1989 | Bartenstein | |
| 5,812,710 A * | 9/1998 | Sugaya | 385/27 |
| 5,907,422 A * | 5/1999 | Ho et al. | 398/209 |
| 6,674,967 B2 * | 1/2004 | Skrobko et al. | 398/72 |
| 2004/0247327 A1 * | 12/2004 | Kamali et al. | 398/202 |
| 2004/0253003 A1 * | 12/2004 | Farmer et al. | 398/214 |
| 2005/0003786 A1 | 1/2005 | Inoue et al. | |
| 2005/0025504 A1 * | 2/2005 | Huang et al. | 398/202 |

OTHER PUBLICATIONS

PCT/US2007/062167 International Search Report mailed Apr. 23, 2008, Feb. 15, 2007, Scientific-Atlanta, Inc.

* cited by examiner

*Primary Examiner*—Ken N Vanderpuye
*Assistant Examiner*—Hibret A Woldekidan
(74) *Attorney, Agent, or Firm*—Tarolli, Sundheim, Covell & Tummino LLP

(57) ABSTRACT

A fiber-to-the-home (FTTH) system transmits forward and reverse optical signals, such as video, voice, and data signals, via optical fiber, and includes a plurality of home network units. The home network units include an optical receiver for receiving at least one of the video, voice, and data signals. Included is a plurality of gain stages that are distributed throughout the optical receiver. The gain stages include a preamplifier stage, two interstage amplifiers, and a postamplifier stage. Two gain control circuits automatically adjust the gain of the video signal based upon the input power level to the FTTH optical receiver. Additionally, a tilt network performs level compensation for externally located coaxial cable. A signal is then provided to a device located within a home via the coaxial cable at the proper RF level having low noise signals.

18 Claims, 4 Drawing Sheets

[[US 7,548,696 B2]]

FIBER-TO-THE-HOME (FTTH) OPTICAL RECEIVER WITH DISTRIBUTED GAIN CONTROL

FIELD OF THE INVENTION

The present invention relates to fiber-to-the-home (FTTH) optical transmission systems and more particularly to an FTTH optical receiver used in such system having distributed gain control for receiving and processing video, voice, and data optical signals while maintaining optimum performance.

BACKGROUND OF THE INVENTION

In recent years there has been a great deal of interest in the transmission of video, voice, and data signals via optical fiber that is pulled to the home, i.e., fiber-to-the-home (FTTH) systems. Traditionally, cable operators have provided video and data signals over a hybrid fiber/coaxial cable (HFC) system. In an FTTH system, optical signals are sent via optical fiber for transmission over longer distances. The optical signals are then converted to radio frequency (RF) signals for transmission over coaxial cable just before entering the home. In contrast, telephone operators have traditionally provided voice and data signals via optical fiber that is pulled to the home, and the signals then enter the home via twisted pair cable as opposed to coaxial cable. As the demand for video, voice, and data services continues to grow, optical fiber solutions continue to gain momentum over the traditional HFC and telephony systems for both the cable and telephone operators. In addition, there are several advantages for utilizing optical fiber that is pulled closer to the home for providing cable and telephone services.

Advantageously, optical fiber systems typically enjoy a high signal quality; lower maintenance and easier troubleshooting; a low attenuation rate; and easy system expansion, to name but a few. Conversely, some of the disadvantages with an optical fiber system are maintaining gain control, powering and power consumption, installation, and simplicity requirements with the equipment, such as optical receivers. What is needed, therefore, is an optical receiver that is capable of offering a complete package of broadband services including video, voice, and data signals over a fiber-to-the-home (FTTH) system while overcoming any of the disadvantages.

DETAILED DESCRIPTION OF A PREFERRED EMBODIMENT

The present invention will be described more fully hereinafter with reference to the accompanying drawings in which like numerals represent like elements throughout the several figures, and in which exemplary embodiments of the invention are shown. This invention may, however, be embodied in many different forms and should not be construed as limited to the embodiments set forth herein; rather, the embodiments are provided so that this disclosure will be thorough and complete, and will fully convey the scope of the invention to those skilled in the art. For example, the present invention may be embodied using discrete components and MMIC amplifiers. Additionally, the present invention may be embodied using a custom RFIC that is incorporated into one integrated circuit. Furthermore, the present invention may also be combined with an optical photodiode, either by co-locating the two in one package or using the same substrate for both optics and radio frequency (RF) electronics. The present invention may be mounted within an enclosure located on an outside wall of a home or business. As such, the power dissipation should be minimized and the circuitry designed for the outdoor environment. Therefore, thermally compensated automatic gain circuitry is important to maintain performance over temperature variations.

It will be appreciated that the present invention addresses the need for an optical receiver that is designed for a fiber-to-the-home (FTTH) system. However, the present invention is not limited to an FTTH system. More specifically, the present invention can also be used in a fiber-to-the-curb (FTTC) system, a fiber-to-the-business (FTTB) system, or a hybrid fiber/coax (HFC) system. Advantageously, in accordance with the present invention, the gain control circuits are distributed throughout the optical receiver in stages in order to address noise and distortion performance, gain control, low power consumption, and a well controlled radio frequency (RF) output level. In this manner, the design of the optical receiver allows FTTH systems the benefit of an extended optical input range while maintaining the required system specifications.

Figure 1:
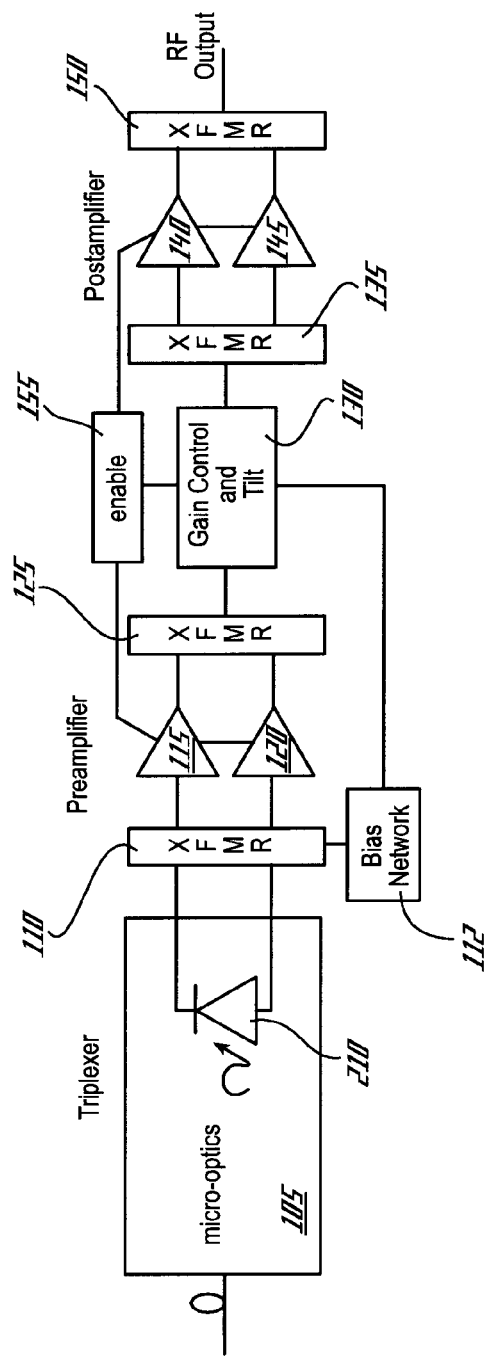
FIG. 1 illustrates a block diagram of a conventional fiber-to-the-home (FTTH) optical receiver.

FIG. 1 illustrates a block diagram of a conventional fiber-to-the-home (FTTH) optical receiver 100. The FTTH optical receiver 100 is capable of receiving multiple wavelength optical signals including video, voice, and data signals from a service provider located upstream. For example, video signals may be sent on a 1550 nanometer (nm) wavelength; downstream, or forward, voice and data signals may be sent using a 1490 nm wavelength; and upstream, or reverse, voice and data signals may be sent using a 1310 nm wavelength. It will be appreciated that wavelengths may differ depending on the fiber equipment used throughout the FTTH system. The FTTH optical receiver 100 is housed within a home mounted unit, such as an optical network unit (ONU) (not shown). The home mounted unit may include additional telephony circuitry for processing the voice and data signals. The voice and data signals may then be provided to the appropriate home equipment via twisted pair cable in a conventional manner.

In addition to the voice and data signals, the optical receiver 100 receives and processes video/audio signals. This is a significant improvement over the conventional ONU that processes exclusively voice and data signals. In this manner, a traditional telephone or cable operator that may already have an FTTH system in place can add the FTTH optical receiver 100 to an existing ONU and process video, voice, and data signals. Typically, the video signals provided to the home via the FTTH optical receiver 100 are of equal or better quality than the video signals that are provided by a conventional HFC system.

Figure 2:
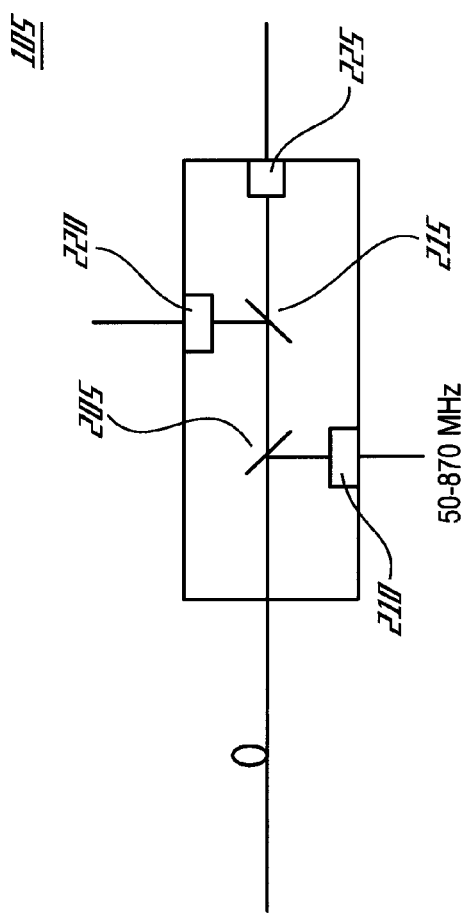
FIG. 2 illustrates a detailed diagram of a triplexer that is suitable for use in the FTTH optical receiver of FIG. 1.

A triplexer 105 distinguishes and separates the different signals having varying wavelengths. These separated signals are then provided to appropriate devices within the ONU or the FTTH optical receiver 100 for further processing. FIG. 2 illustrates a detailed diagram of the triplexer 105 that is suitable for use in the FTTH optical receiver 100. The triplexer 105 receives the optical signals and, depending upon the wavelength of the received signals, routes them to an appropriate internal photodiode. More specifically, a video mirror 205 reflects the video signals determined by the wavelength to a video photodiode 210. Currently, the preferable wavelength for transmitting video signals is at 1550 to 1560 nm due to existing fiber equipment; low losses in the fiber at this wavelength; EDFA technology; and the availability of lasers, to name a few. The video photodiode 210 provides video signals in a forward frequency to amplifier stages within the FTTH optical receiver 100. A typical forward frequency used for video signals is from 45 to 1000 Mega Hertz (MHz). A second mirror 215 reflects a second wavelength, for example, 1490 nm, to a second photodiode 220. The second photodiode 220 then outputs a digital stream at, for example, 155 mega bits per second (mbps) that includes the voice and data signals. A laser 225 provides an optical digital stream output at, for example, 155 mbps that includes the voice and data signals. The digital photodiode 220 and laser 225 provide the digital streams to and from additional circuitry (not shown) in the ONU for processing in a conventional manner and then to twisted pair cable that is routed throughout the home. It will be appreciated, however, that a diplexer or a standard photodiode can be used for video services only. Further information regarding the triplexer that can be used in an optical receiver can be found in U.S. Pat. No. 6,674,967 entitled "Fiber To The Home (FTTH) Optical Receiver having Gain Control and a Remote Enable" by a common inventor, the disclosure and teachings of which are incorporated herein by reference.

Referring again to FIG. 1, the video photodiode 210 has three outputs. Two outputs are provided to a transformer 110 for matching the video signals to a preamplifier stage; a third output (not shown) is a ground pin. It will be appreciated that the matching can be accomplished in a number of ways, but a preferred embodiment of the present invention accomplishes the matching through the transformer 110 and a bias network 112. These also serve to improve the optical receiver noise performance. The photodiode 210 and the transformer 110 provide two anti-phased RF current connections, one at 0° and one at 180°, to the inputs of two push-pull amplifiers 115, 120. The broadband current signals from the photodiode 210 are converted to amplified RF voltage signals in the amplifiers 115, 120 before being coupled to a combining transformer 125.

Gain stages comprising amplifiers 115, 120 and 140, 145 utilize a push-pull application as described in U.S. Pat. No. 5,347,389, the teachings of which are herein incorporated. The gain stages (i.e., preamplifier stage and postamplifier stage) are designed to provide sufficient gain to drive a home network that has typical losses associated with a 4-way splitter and coaxial cable. It will be appreciated that the amplifiers 115, 120, 140, 145 could, alternatively, be single ended amplifier stages, as long as their linearity performance is sufficient. Using single ended amplifiers also eliminates transformers 125 and 135, thereby reducing costs.

A gain control and tilt combination network 130 receives the combined RF signal. The gain control portion of the network 130 compensates for a wide range of input optical power provided by the FTTH system. It will be appreciated that it is possible to construct an FTTH system without requiring a gain control network. In this manner, however, the operator must construct a system with predetermined optical fiber lengths and known RF input levels of the home in order to set the amplifier stages to the appropriate level. Though more difficult to design and implement, it will also be appreciated that if a gain control network is not used, transformers 125, 135 are no longer necessary. In the preferred embodiment of the present invention, however, the gain control portion of the network 130 is provided to accommodate flexibility in systems having varying fiber lengths and RF input levels.

The gain control network 130 is an open loop gain control network that derives the appropriate gain by sensing the optical input power level from the output of the photodiode 210. A predetermined backoff amount is set to maintain an acceptable input signal level to the home. A bridge-tee circuit utilizing PIN diodes, for example, sets the predetermined backoff in the network 130. In this manner, installation of the FTTH optical receiver 100 is simplified by using the predetermined backoff because there is no need to set the output RF level as required by conventional optical receivers and amplifiers. Additionally, the predetermined backoff amount is valid if the Optical Modulation Index (OMI) is known and constant. A less expensive AGC network approach involves limiting the gain variability to either a 0 dB loss or a 10 dB loss. The threshold point can be adjusted to optimize noise performance, but keep the RF output levels within allowable limits. A hysteresis network can also be implemented to control the circuitry and eliminate any oscillatory states around the threshold point.

The gain control portion of the network 130 is an interstage device located between the preamplifier stage and a postamplifier stage. Alternatively, the gain control could be placed at the output of the receiver 100; however, interstage positioning reduces the linearity requirements of the postamplifier. The output of the gain control and tilt network 130 is provided to a transformer 135 for matching the RF signal to two push-pull postamplifiers 140 and 145. A final transformer 150 receives the amplified RF signals and combines the RF signals for transmission through the coaxial cable to, for example, a set-top device.

Figure 3:
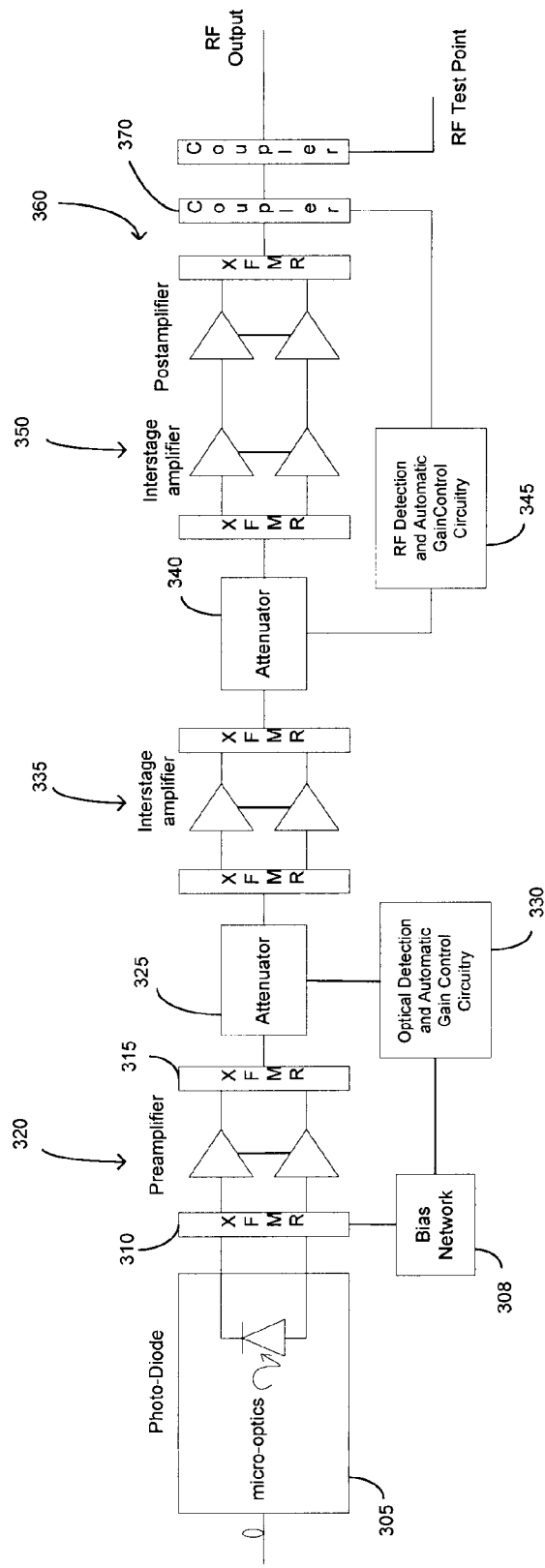
FIG. 3 is a first embodiment of an optical receiver in accordance with the present that is suitable for use in an FTTH system.

FIG. 3 is a first embodiment of an optical receiver in accordance with the present invention that is suitable for use in an FTTH system. The optical receiver 300 in accordance with the present invention utilizes several gain stages as opposed to the conventional optical receiver 100 of FIG. 1. More specifically, in accordance with the present invention, the gain stages 320, 335, 350, 360 are distributed throughout the optical receiver 300 rather than just implementing a preamplifier and a postamplifier stage as shown in FIG. 1. In a conventional optical receiver 100, a higher power gain stage is required to maintain the linearity specifications of the RF output that is required due to the fluctuating input optical level in an FTTH system. Conversely, in accordance with the present invention noise performance is optimized and RF signal levels are prevented from increasing beyond the gain stages linear region, thus allowing for smaller, lower power consumption gain stages. It will be appreciated that the stages can be implemented in different ways, such as using an open or a closed loop circuit, a predetermined backoff or RF filters and detectors if the OMI is not known or may change due to channel loading.

A photodiode 305 receives the input optical signal and converts the optical signal into an RF signal. It will be appreciated that the photodiode 305 can be a stand-alone device if external wave division multiplexing (WDM) components are used. Additionally, the photodiode 305 as shown could also be a diplexer or a triplexer module that includes the WDM components. Furthermore, the photodiode 305 can be biased in a number of ways such as integrated together with a receiver integrated circuit, but in a preferred embodiment of the present invention it is accomplished through a bias network 308 and a transformer 310, which also serves to improve optical receiver noise performance.

The RF output of the photodiode 305 is provided to preamplifier stage 320. The preamplifier stage 320, including transformers 310, 315 and amplifiers, matches the RF output signal to a lower output impedance. It will be appreciated that the stages 320, 335, 350, 360 are designed to provide sufficient gain to drive a home network comprising a 4-way splitter and coaxial cable loss. The final RF output impedance of the optical receiver 300 is 75 Ohms, which is a typical requirement for an in-home distribution network. It will also be appreciated that in a preferred embodiment of the present invention, the amplifiers in the stages are push-pull circuits, but could be single ended stages, if linearity performance is sufficient. As mentioned, a single-ended stage or push pull circuits used concurrently 350 and 360, would eliminate some transformers in the optical receiver, thereby reducing cost. If the input noise performance of the preamplifier stage 320 is low, cost may also be reduced by eliminating the input transformer 310 and biasing the photodiode 305 through RF inductor chokes in a known manner.

Attenuator 325 and gain control network 330 compensate for a wide input optical power that could be received from the FTTH system. Prior to any gain control, a possible 15 dB variation in input optical power correlates to a 30 dB variation in RF level, which is excessive for connected televisions and set-top terminals in the home network. Accordingly, attenuators and gain control circuits are necessary to maintain an acceptable input signal level to the home, while maintaining the requirements for good noise performance, good linearity, and low power consumption. A preferred embodiment of the present invention incorporates an open loop compensation circuit derived from a sense line from the photodiode 305. Optical input power is first sensed by optical detection circuitry included in the gain control circuit 330. A first attenuator 325 then attenuates the input signal level when the optical level increases in power beyond a predetermined threshold. This allows the optical receiver 300 to optimize its noise performance until the system that provides the input optical signal achieves a sufficient signal-to-noise level. As the input signal level attenuates, the noise of the optical receiver 300 is degraded; however, this attenuation helps achieve the desirable output linearity requirement by preventing the input signal from over-driving the interstage amplifier 335 and each subsequent gain stage 350, 360.

A second attenuator 340 is always operational and located after the first two gain stages 320, 335. With the location between the two stages 335, 350, the second attenuator 340 limits its direct effect on the noise performance of the optical receiver. More specifically, the second attenuator 340 allows the first attenuator 325 the capability of delaying when it switches to allow better noise performance. When the first attenuator 325 switches, the second attenuator 340 backs off automatically to maintain a desired level. Additionally, since the attenuator 340 is located prior to the output gain stages 350, 360, the RF level of the signal is further attenuated prior to output gain stages 350, 360. This additional attenuation allows the optical receiver 300 to have a constant output level and prevents the output gain stages 350, 360 from being overdriven into a non-linear region. The closed-loop second attenuator 340 uses a power detection circuit and receives its input from coupler 370. Additionally, coupler 370 provides the RF output signal to the home network.

As also shown in FIG. 3, the optical receiver 300 of the present invention can also include remote enabling. The service provider can disable the optical receiver 300 remotely through the network. The communication between the service provider and the optical receiver 300 uses a wavelength on the fiber to provide a bidirectional digital signal path. The enable function interrupts power to the gain stages 320, 335, 350, 360, thereby providing adequate isolation to shut off any video signals to the home. The bias for the photodiode 305 is still maintained, however, which allows monitoring of the optical signal integrity, regardless of the state of the video output. An additional benefit is the reduction in power consumption of the home mounted unit, if video service is not desired.

Figure 4:
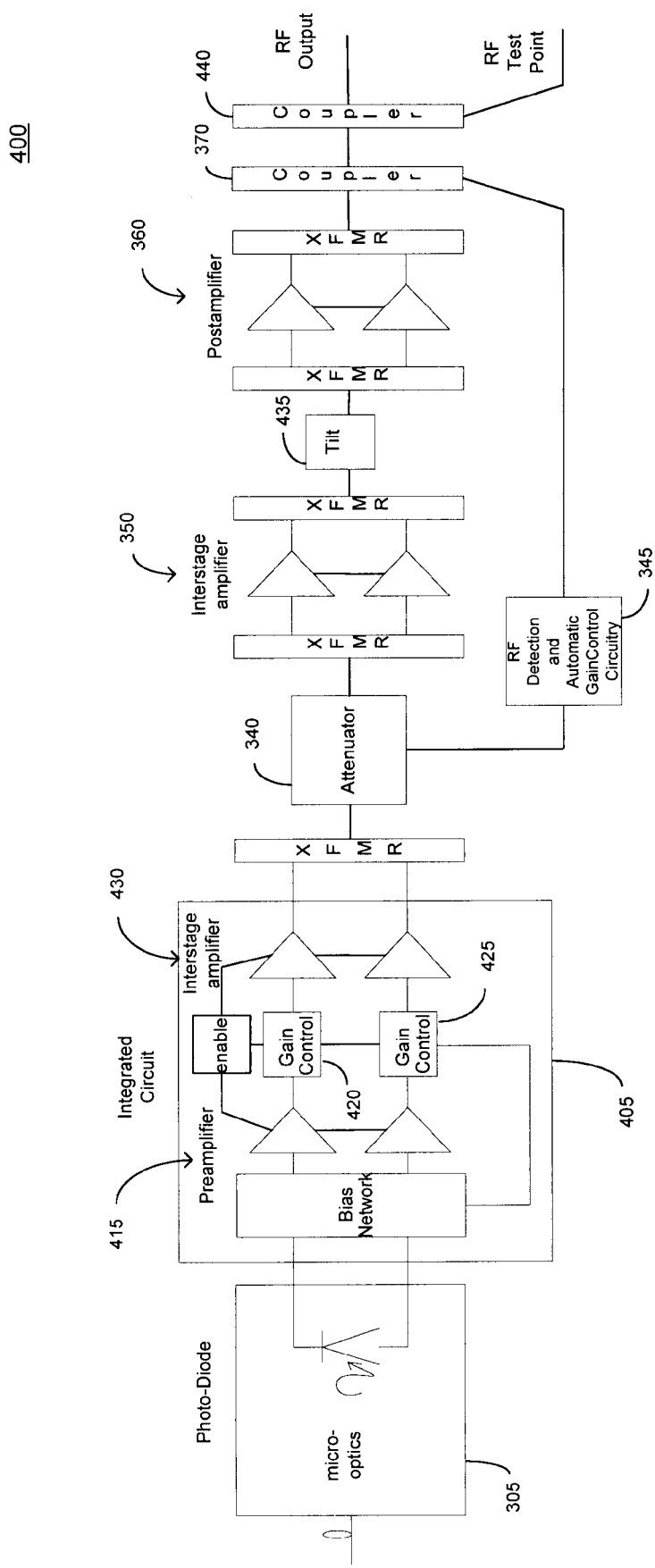
FIG. 4 is a second embodiment of an optical receiver in accordance with the present invention that is suitable for use in an FTTH system.

FIG. 4 is a second embodiment of an optical receiver in accordance with the present invention. An integrated circuit 405 incorporates a preamplifier stage 415 and a first interstage amplifier 430 into one package. It will be appreciated that the integrated circuit 405 can also be coupled to the photodiode 305 either by co-locating the two circuits in one package or using the same substrate for both optics and RF electronics. The optical receiver 400 can then be mounted within an enclosure on an outside wall of a home or business. Included in the integrated circuit 405 may also be a bias network 410 and remote enabling. Gain control circuits 420, 425 are coupled between the preamplifier stage 415 and the interstage amplifier 430.

The optical receiver 400 also comprises an attenuator 340 and RF detection and automatic gain control circuitry 345. A tilt network 435 is then coupled between the second interstage amplifier 350 and the postamplifier stage 360 to ensure that the RF output is provided with the appropriate tilt for the in-home network due to any RF cable losses. Also included is a coupler 440 that operates as an RF test point allowing the service provider to verify the RF levels at the output of the receiver 400.

The above describes an optical receiver in accordance with the present invention that addresses the need to receive a varying wide input optical signal and continue to provide a linear RF output with good noise distortion performance. It will also be appreciated that as mentioned there are several different embodiments of the optical receiver that perform in a like manner as the embodiments shown while still embodying the scope of the present invention.

What is claimed is:

1. In a fiber-to-the-home (FTTH) system for transmitting forward and reverse optical signals via optical fiber, the FTTH system including a plurality of home network units, the plurality of home network units including an optical receiver for receiving at least one of video, voice, and data signals, and for providing the at least one video, voice, and data signals to a connected device via coaxial cable, the optical receiver comprising:

a photodiode for converting an optical signal into an RF signal;

a plurality of gain stages for amplifying the RF signal throughout the optical receiver, wherein the plurality of gain stages comprises a preamplifier and a postamplifier stage and a first and second interstage amplifier coupled between the preamplifier and postamplifier stages, whereby positioning the plurality of gain stages throughout the optical receiver provides a postamplifier output signal having a desired level with a low output noise signal;

an attenuator coupled between the first interstage amplifier and the second interstage amplifier, the attenuator configured to attenuate the RF signal from the first interstage amplifier based on an RF control signal; and a gain control network coupled to an output of the postamplifier stage, the gain control network providing the RF control signal that is indicative of a level associated with the postamplifier output signal.

2. The FTTH system of claim 1, wherein the gain control network is a second gain control network and the attenuator is a second attenuator, the optical receiver further comprising:
   a first gain control network for receiving the RF signal from the photodiode, wherein the RF signal comprises an input power level of the optical signal, and for providing an optical control signal; and
   a first attenuator coupled between the preamplifier stage and the first interstage amplifier, the first attenuator for receiving the optical control signal and attenuating the RF signal when the optical control signal indicates that the input power level of the optical signal is beyond a predetermined threshold.

3. The system of claim 2, wherein the optical receiver further comprises an optical power sense circuit for providing the input power level to the first gain control network.

4. The FTTH system of claim 1, wherein the optical receiver further comprises:
   an enable circuit for receiving a control function signal from the FTTH system, wherein the enable circuit interrupts power to at least some of the plurality of gain stages to Prevent the RF signal from being delivered to the connected device based on the control function signal from the FTTH system, the control function signal indicating indicates a power limiting function to the plurality of gain stages,
   wherein when the power limiting function is enabled, the RF signal is prevented from being delivered to the connected device.

5. The system of claim 1, the optical receiver further including a biasing circuit wherein the biasing circuit is a transformer biasing circuit.

6. The FTTH system of claim 1, the optical receiver further including a biasing circuit, wherein the biasing circuit is a resistor biasing circuit.

7. The system of claim 1, wherein the attenuator is a first attenuator and the gain control network is a first gain control network, the optical receiver further comprising:
   a second gain control network for receiving the RF signal from the photodiode and for providing an optical control signal, wherein the RF signal comprises an input power level of the at least one optical signal;
   a second attenuator coupled between the preamplifier stage and the first interstage amplifier, the second attenuator for receiving the optical control signal and attenuating the RF signal when the input power level of the optical signal is beyond a predetermined threshold; and
   an enable circuit for receiving a control function signal from the FTTH system, the enable circuit interrupts power to the plurality of gain stages to prevent the RF signal from being delivered to the connected device based on the control function signal.

8. The system of claim 1, wherein the optical receiver further comprises:
   a first transformer coupled to between the first interstage amplifier and the attenuator; and
   a second transformer coupled between the attenuator and the second interstage amplifier.

9. In a fiber-to-the-home (FTTH) system for transmitting forward and reverse optical signals via optical fiber, the FTTH system including a plurality of home network units, the plurality of home network units including an optical receiver for receiving at least one of video, voice, and data signals, and for providing the at least one of the video, voice, and data signals to a connected device via coaxial cable, the optical receiver comprising:
   a photodiode for converting an optical signal into an RF signal;
   a plurality of gain stages for amplifying the RF signal throughout the optical receiver,
   wherein the plurality of gain stages comprises a preamplifier and a postamplifier stage and a first and second interstage amplifier coupled between the preamplifier and postamplifier stages,
   whereby positioning the plurality of gain stages throughout the optical receiver provides a postamplifier output signal having a desired level with a low output noise signal;
   a first gain control network for receiving the RF signal from the photodiode, wherein the RF signal comprises an input power level of the at least one optical signal, and for providing an optical control signal;
   a first attenuator coupled between the preamplifier stage and the first interstage amplifier, the first attenuator for receiving the optical control signal and attenuating the RF signal when the input power level of the optical signal is beyond a predetermined range;
   a second attenuator coupled between the first and second interstage amplifiers; and
   a second gain control network coupled to an output of the postamplifier stage, the second gain control network for providing an RF control signal that is indicative of a level associated with the postamplifier output signal.

10. The FTTH system of claim 9, wherein the second attenuator attenuates the RF signal based on the RF control signal in order to maintain the postamplifier output signal at the desired level.

11. The FTTH system of claim 9, wherein, when the first attenuator switches, the second attenuator backs off automatically to maintain the desired level of the postamplifier output signal.

12. A method of providing an amplified RF output signal, the method performing the steps of:
   receiving an input optical signal at an optical receiver;
   converting the input optical signal into an RF signal;
   amplifying the RF signal with a plurality of gain stages located throughout the optical receiver to provide an RF output signal having a desired level,
   wherein the plurality of gain stages comprise a preamplifier stage, a first interstage amplifier, a second interstage amplifier, and a postamplifier stage;
   attenuating the RF signal with a first attenuator at an output of the preamplifier stage when an input level of the RF signal is beyond a predetermined threshold; and
   attenuating the RF signal with a second attenuator positioned between the first and second interstage amplifiers;
   providing the second attenuator an RF control signal that is indicative of a level associated with the RF output signal, wherein the second attenuator attenuates the RF signal based on the RF control signal to maintain the output RF signal at the desired level.

13. The method of claim 12, further performing the steps of:
   prior to amplifying the RF signal, determining the input level of the RF signal.

14. The method of claim 13, further performing the step of sensing the input level of the input optical signal and providing the input level to a first gain control network.

15. The method of claim 12, further performing the step of backing off the attenuation automatically when the first attenuator begins switching in order to maintain the desired level of the RF output signal.

16. A communications system comprising an optical receiver, the optical receiver for receiving an optical input signal and providing an RF output signal, the optical receiver comprising:
- a photodiode for converting an optical signal having an optical level into an RF signal having an RF level, where the RF level is equivalent to the optical level;
- a preamplifier stage coupled to the photodiode for receiving the RF signal and for providing an amplified signal;
- a first attenuator coupled to the preamplifier stage for attenuating the RF level in accordance with an optical control signal;
- a first and second interstage amplifier coupled to the first attenuator for amplifying the RF signal;
- a second attenuator coupled to the second interstage amplifier for further attenuating the RF level in accordance with an RF control signal;
- a postamplifier stage coupled to the second attenuator for final amplification of the RF signal,
- wherein the RF level of the RF signal provided by the postamplifier stage is at the predetermined level;
- a first gain control network for receiving the RF signal from the photodiode and for providing the optical control signal indicative of the level of the RF signal from the photodiode; and
- a second gain control network for receiving the RF signal from the postamplifier stage and providing the RF control signal to the second attenuator indicative of the level of the RF output signal.

17. The communications system of claim 16, wherein, when the first attenuator switches, the second attenuator backs off automatically to maintain the desired level of the postamplifier stage RF signal.

18. The communications system of claim 16, further comprising an enable circuit for receiving a control function signal from the communications system, wherein the control function signal indicates a power limiting function of the preamplifier stage, the first and second interstage amplifiers, and the postamplifier stage, wherein when the power limiting function is enabled, the postamplifier stage RF signal is prevented from being transmitted.

* * * * *